United States Patent [19]

Nakasuji et al.

[11] Patent Number: 5,894,132
[45] Date of Patent: Apr. 13, 1999

[54] CHARGED-PARTICLE-BEAM PROJECTION-EXPOSURE APPARATUS WITH FOCUS AND TILT ADJUSTMENTS

[75] Inventors: Mamoru Nakasuji, Yokohama; Shohei Suzuki, Tokyo, both of Japan

[73] Assignee: Nikon Corporation, Tokyo, Japan

[21] Appl. No.: 08/822,857

[22] Filed: Mar. 24, 1997

[30] Foreign Application Priority Data

Mar. 22, 1996 [JP] Japan ................. 8-066098

[51] Int. Cl.$^6$ ................. H01L 21/30; H01J 37/304
[52] U.S. Cl. ................. 250/492.22; 250/492.23; 250/491.1; 250/442.11
[58] Field of Search ............. 250/492.22, 492.2, 250/491.1, 442.11, 492.23

[56] References Cited

U.S. PATENT DOCUMENTS

| | | | |
|---|---|---|---|
| 4,849,901 | 7/1989 | Shimizu | 364/468 |
| 4,891,526 | 1/1990 | Reeds | 250/442.11 |

FOREIGN PATENT DOCUMENTS

| | | | |
|---|---|---|---|
| 2-284413 | 11/1990 | Japan | 250/492.2 |
| 5-182897 | 7/1993 | Japan | 250/491.1 |

*Primary Examiner*—Jack I. Berman
*Attorney, Agent, or Firm*—Klarquist Sparkman Campbell Leigh & Whinston, LLP

[57] ABSTRACT

Charged-particle-beam projection-exposure apparatus are disclosed for transferring patterns from a mask to a sensitized substrate. By measuring the height and tilt of regions of the sensitized substrate relative to the location of the projected image of the mask before the regions are exposed to the charged particle beam, the charged-particle-beam optical system and the wafer tilt and position can be corrected, maintaining a high-quality image of the mask on the sensitized substrate. Measuring the height and tilt of a region of the sensitized substrate before exposure of that region begins has several advantages. The measurements permit adjustments so that high-resolution images of the mask are transferred to the sensitized substrate even if wafer height and tilt vary rapidly. In addition, because the measurements of tilt and height occur away from the exposure region, height and tilt measuring devices do not restrict the placement or size of charged-particle-beam optical elements.

10 Claims, 3 Drawing Sheets

CHARGED-PARTICLE-BEAM PROJECTION-EXPOSURE APPARATUS WITH FOCUS AND TILT ADJUSTMENTS

FIELD OF THE INVENTION

The invention concerns a charged-particle-beam lithography system using an electron or ion beam to transfer patterns from a mask to a-sensitized substrate.

BACKGROUND OF THE INVENTION

Charged-particle-beam lithography systems have been developed for transferring patterns from masks to sensitized substrates. Such systems permit the rapid transfer of-high-resolution patterns to the sensitized substrate and are important in the manufacture of electronic devices, particularly integrated circuits.

Conventional charged-particle-beam lithography systems are static transfer systems that transfer the pattern of a single die (a die is equivalent to one integrated circuit) or of multiple dies in a single transfer (exposure) step. These conventional systems face several difficulties. First, the pattern mask for a static transfer system is difficult to fabricate. Second, the control of aberrations in the charged-particle-beam optical system (termed generally the "optical system" herein) across an optical field as large as one or more dies requires complex optical elements.

To overcome the difficulties summarized above, charged-particle-beam lithography systems have been developed in which the pattern on the mask is divided into multiple smaller regions termed "subfields." Such systems transfer the pattern on the mask subfield-by-subfield. In such a "subfield-by-subfield" lithography system, the mask is divided into a plurality of smaller regions. The patterns in the smaller regions are then transferred one at a time to the sensitized substrate. The transfer of the patterns in these smaller regions is less demanding on the optical system so that optical aberrations are reduced and high-resolution patterns are more readily transferred to the sensitized substrate. Because the mask is divided into smaller regions, mask fabrication is simpler.

Subfield-by-subfield pattern-transfer systems are commonly used in the manufacture of integrated circuits. With such systems, the sensitized substrate is generally a semiconductor wafer that is coated with a thin layer of resist, the "resist" being a material sensitive to the charged particle beam. In the subfield-by-subfield transfer method, the mask and the wafer are moved continuously and synchronously together in a fixed direction (hereinafter "scan direction") by their respective mounting stages. The mask pattern to be transferred is divided into a series of field bands extending in a direction perpendicular to the scan direction. During scanning, as each field band approaches the optical axis of the optical system, the patterns within the field band are transferred to the wafer. By exposing regions of the wafer near the optical axis to the charged particle beam, optical aberrations are reduced.

The height of the wafer surface generally varies across the wafer surface. Not only are there variations in wafer thickness but also there may be particles between the wafer and its mounting stage, causing the wafer to deform when held in the stage. If these height variations are not corrected, the surface of the wafer being exposed by the charged particle beam may be beyond the depth of focus of the optical system, causing blurring in the image of the projected patterns. The wafer may also be tilted with respect to the optical system; this tilt may appear as an optical-system defocus that varies across the wafer surface.

According to one conventional method for overcoming wafer-height variations, deformations, and tilt, the height of the wafer is measured at a measurement point on or near the region in which the wafer is being exposed to the charged particle beam. The result of this measurement is then used either to electrically correct the focus of the optical system or to move the wafer with a mechanical height adjustment to the wafer mounting stage.

In conventional systems, the wafer height is measured at a point on the wafer within or near the exposure region of the lithographic system. Because the wafer is moving continuously in the scan direction, the measurement point moves before the focus corrections are made. If $T_A$ and $T_B$ are the times required to measure the wafer height and subsequently correct the optical system focus respectively, and if the scanning speed of the wafer is $V_W$, the wafer will move a distance $(T_A+T_B) \cdot V_W$ in the time required to measure and correct focus errors. As a result, conventional systems are generally unable to maintain focus if there are rapid changes in wafer height and large focus errors are possible. This causes a loss of resolution in the transferred patterns in wafer regions with rapid changes in wafer height.

SUMMARY OF THE INVENTION

One object of this invention is to provide a charged-particle-beam lithography system that forms well-focused images of patterns of a mask on a substrate even if there are rapid changes in substrate surface height or substrate deformations. As will be readily apparent, such a charged-particle-beam lithography system is particularly important for high-resolution pattern transfers in which the wafer (or other-substrate) is scanned.

Focus errors associated with a non-planar or tilted substrate surface are readily eliminated by measuring the substrate surface before the substrate enters the exposure region. For example, by using a focus-position sensor to measure and store the height of the substrate surface before the scanning and pattern transfer operations begins, the focus can be corrected. With the relative heights stored, the stored information permits focus of the pattern images appropriately for each location on the substrate. Because the charged-particle-beam lithography system scans the substrate during exposure, substrate heights may be readily obtained by scanning and measuring the substrate without exposing the substrate to the charged particle beam.

In an alternative arrangement, focus sensors measure the substrate height during exposure by measuring height in regions of the substrate (hereinafter "read-ahead regions") before the regions reach the exposure region of the charged-particle-beam lithography system. For example, if the substrate is scanned in a single direction, a single focus-position sensor measures the substrate height in a read-ahead region of the substrate before the read-ahead region enters the exposure region of the charged-particle-beam lithography system. If the substrate is scanned bidirectionally but along a single axis, two focus-position sensors are needed, one on each side of the exposure region with respect to the scan direction.

These latter two arrangements of focus-position sensors permit height measurements to be taken during a conventional subfield-by-subfield exposure sequence; a pre-exposure substrate scan for the sole purpose of measuring height is unnecessary. Such placement of the focus-position sensors has an additional advantage in that the focus-position sensors are displaced from the exposure region. Therefore, the focus-position sensors do not interfere with the charged-particle-beam optical system, permitting large optical elements and short working distances to be used.

Because the focus-position sensors measure substrate height in read-ahead regions before entry into the exposure region, focus can be adjusted to accommodate height variations in the read-ahead regions without errors caused by the scanning of the substrate. The charged-particle-beam lithography system can then coordinate focus adjustment of the relatively fast electrically-controlled charged-particle-beam optical system and the more slowly responding mechanical stages holding the mask and the substrate.

The forgoing and other objects, features, and advantages of the invention will become more apparent from the following detailed description of a preferred embodiment which proceeds with reference to the accompanying drawings.

BRIEF DESCRIPTION OF THE DRAWINGS

FIG. 4($b$) shows an arrangement of transfer subregions on a wafer onto which the mask subfields are transferred in an ordered way.

DETAILED DESCRIPTION OF A PREFERRED EMBODIMENT

Figure 4A:
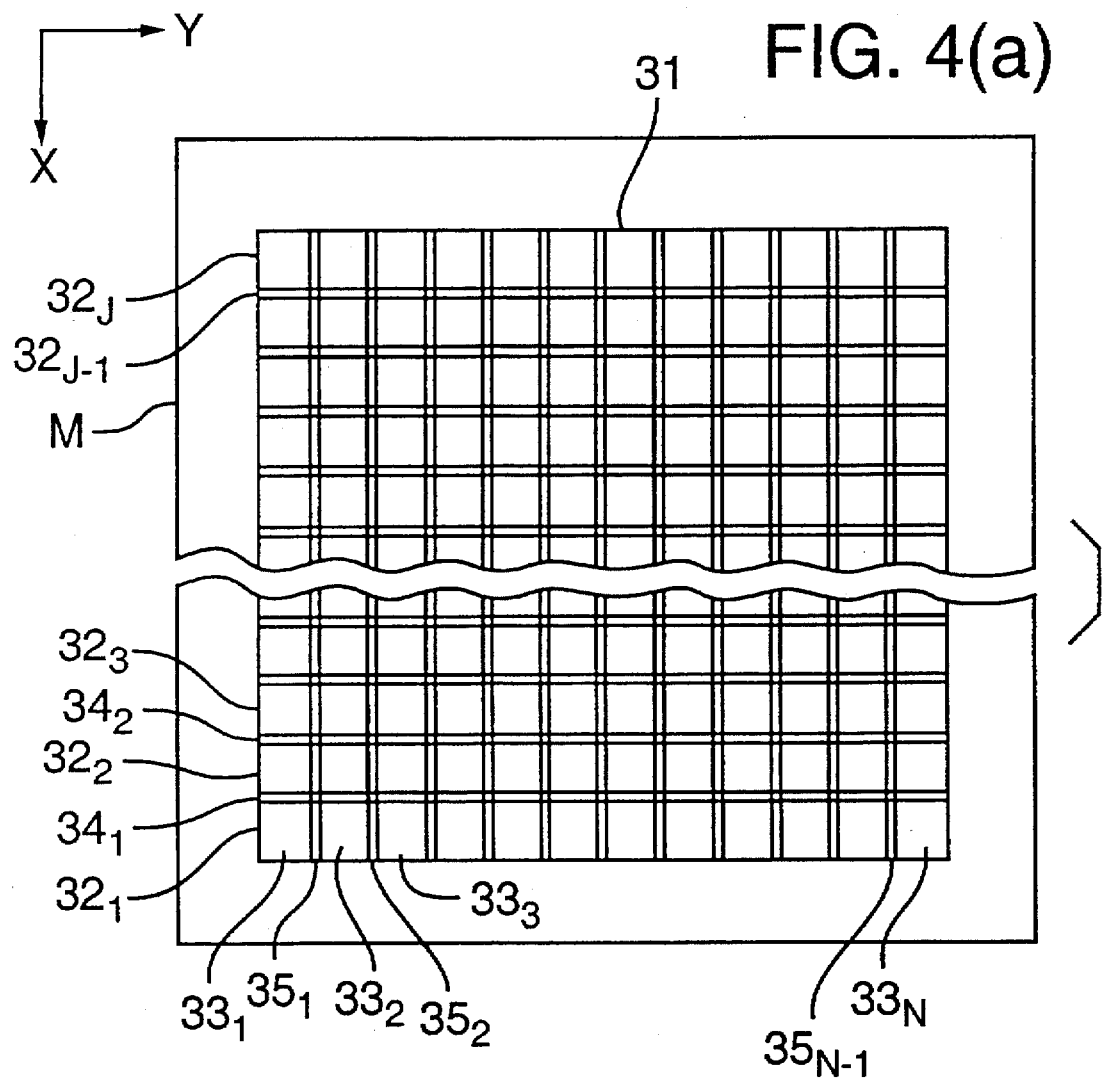
FIG. 4 ($a$) shows an arrangement of subfields on a mask for use in the FIG. 1 embodiment.
Figure 4B:
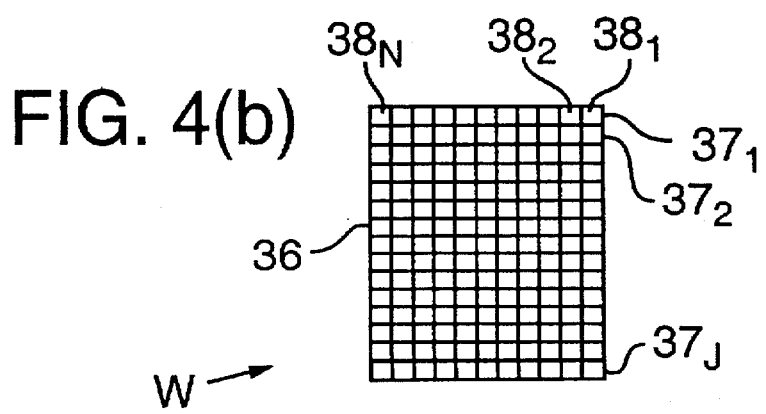

An electron-beam projection-exposure apparatus of the preferred embodiment transfers patterns from a mask M to a sensitized wafer W. FIG. 4 ($a$) shows one example of the mask M. A patterned region 31 of the mask M is divided in the X direction (the scan direction) into J field bands $32_1$, $32_2, \ldots, 32_J$ of fixed width. The field bands $32_1, 32_2, \ldots, 32_J$ are further divided in the Y direction (the cross-scan direction), thereby dividing the mask M into N subfields $33_1$, $33_2, \ldots, 33_N$. The patterns to be transferred are within the subfields $33_1, 33_2, \ldots, 33_N$. The subfields are all the same size, but it will be apparent that other divisions of the patterned region 31 are possible. Boundary strips $34_1$, $34_2, \ldots, 34_{J-1}$ and $35_1, 35_2, \ldots, 35_{N-1}$, parallel to the Y- and X-axes, respectively, separate the subfields $33_1$, $33_2, \ldots, 33_N$. The boundary strips generally contain no patterns and serve to prevent overlap between patterns of adjacent subfields.

FIG. 4($b$) shows a transfer region 36 of the wafer W which is coated with a resist sensitive to an electron beam. The transfer region 36 typically corresponds to a single die; the transfer region 36 is normally one of a plurality of similar transfer regions on the wafer W. The transfer region 36 is divided in the X direction into fixed-width transfer region bands $37_1, 37_2, \ldots, 37_J$. Each of the transfer region bands is respectively subdivided in the Y direction into N transfer subregions $38_1, 38_2, \ldots, 38_N$ of equal size. The patterns of the field bands $32_1, 32_2, \ldots, 32_J$ of the mask M are demagnified and transferred to the corresponding transfer-region bands $37_1, 37_2, \ldots, 37_J$ on the wafer W. Within each of the transfer-region bands, the patterns of subfields $33_1$, $33_2, \ldots, 33_N$ of the mask M are respectively transferred to transfer subregions $38_1, 38_2, \ldots, 38_N$ on the wafer W.

The patterns of the subfields $33_1, 33_2, \ldots, 33_N$ are transferred to the wafer W such that they are displaced in the X and Y directions so that the transfer subregions $38_1, 38_2, \ldots, 38_N$ contact each other without boundary strips. The displacement of a selected transfer subregion in the Y direction is the sum of the demagnified widths of the boundary strips $35_1, 35_2, \ldots, 35_{N-1}$ that come between the selected subfield and the optical axis AX. In addition, the transfer region bands $37_1, 37_2, \ldots, 37_J$ on wafer W are in direct contact on their X-facing edges. As a result, images of the subfields $33_1, 33_2, \ldots, 33_N$ are transferred without boundaries between the subfields.

The mask M may be any of several types of electron-beam mask M. One type is the so-called scattering mask in which the areas that transmit the electron beam are made of a thin film of silicon nitride (SiN) or similar material and the areas that scatter an electron beam are made of a thin film of tungsten or a similar material on top of the silicon nitride film. Another suitable type of electron-beam mask is the so-called perforated stencil mask in which perforations in a scattering substrate such as tungsten transmit the electron beam. The boundary strips $34_1, 34_2, \ldots, 34_{J-1}$ and $35_1$, $35_2, \ldots, 35_{N-1}$ of the mask M contain no patterns and generally block or scatter the electron beam.

Figure 1:
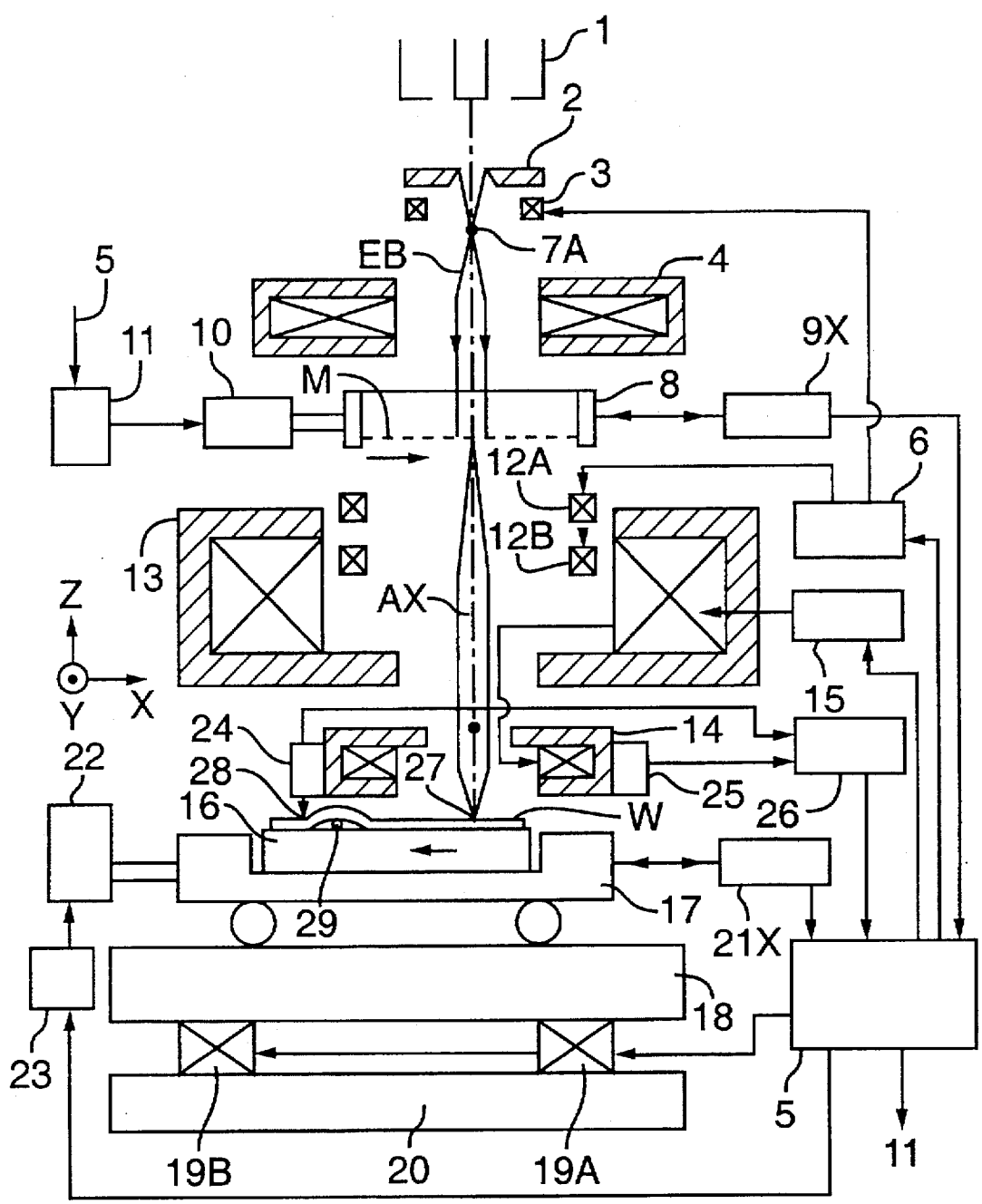
FIG. 1 is an elevational schematic depiction of an electron-beam projection-exposure apparatus according to a preferred embodiment of the invention.
Figure 2:
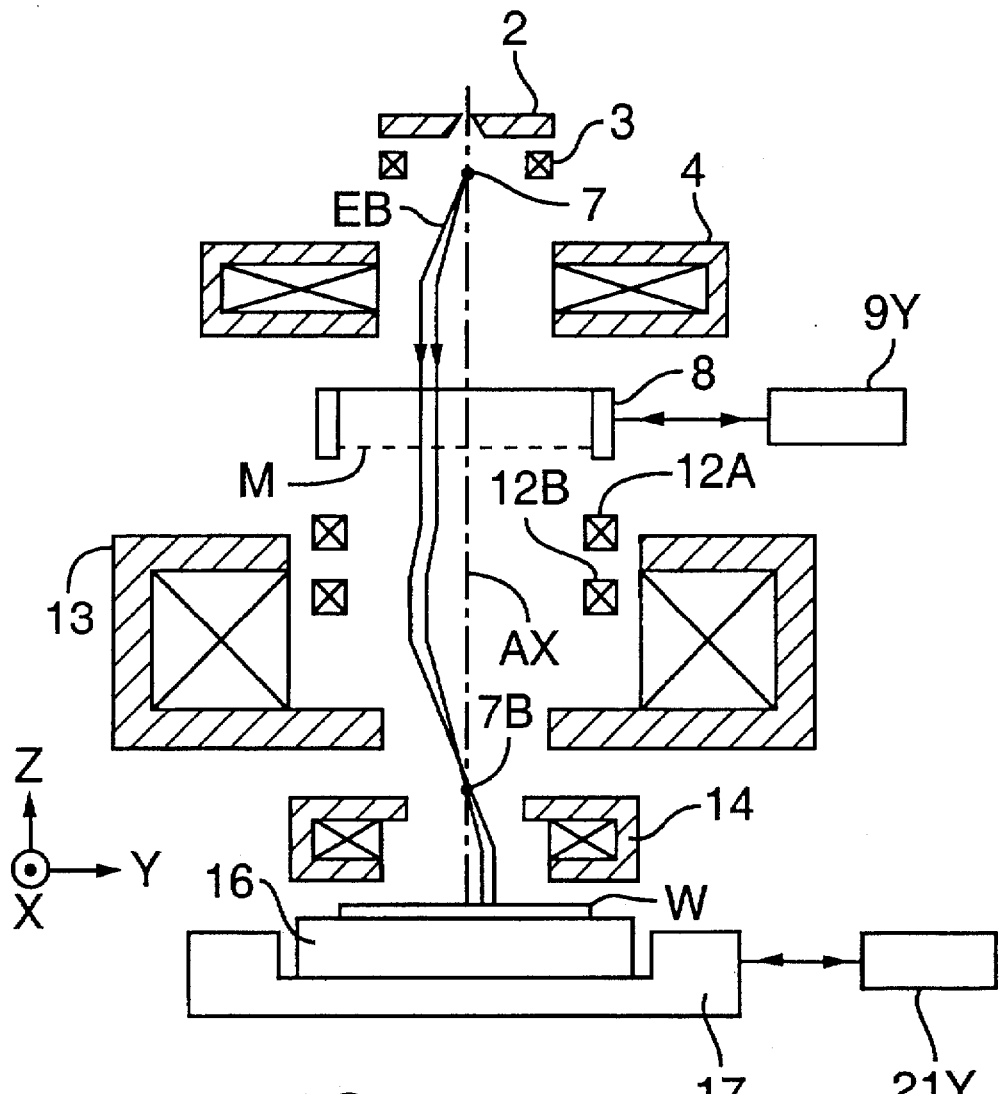
FIG. 2 shows certain features of the electron-beam projection-exposure apparatus of FIG. 1 viewed from the X direction.

FIG. 1 shows the layout of a preferred embodiment of an electron-beam projection-exposure apparatus that uses a subfield-by-subfield exposure method to transfer patterns from the mask M to the wafer W. For convenience in describing this embodiment, coordinate axes are chosen such that the Z-axis is parallel to an optical axis AX and the X-axis is parallel to the plane of the page of FIG. 1; the Y-axis is perpendicular to both the X-axis and the Z-axis. The electron-beam projection-exposure apparatus of FIG. 1 is also shown in FIG. 2, but viewed such that the X-axis is perpendicular to the plane the page of FIG. 2.

An electron gun 1 emits electrons, some of which are captured by a condenser lens (not shown). The condenser lens forms an electron beam EB and directs the electron beam EB to an aperture plate 2. The electron beam EB passes through a rectangular opening in the aperture plate 2 and then forms a first crossover 7A. A subfield selection deflector 3 then deflects the electron beam EB along the X-direction. A condenser lens 4 collimates the electron beam EB so that it propagates parallel to an optical axis AX of the electron optical system. The optical axis AX is generally an axis through the center of the electron optical system.

The electron beam EB is then incident upon a selected subfield that is one of the subfields $33_1, 33_2, \ldots, 33_N$ within one of the field bands $32_1, 32_2, \ldots, 32_J$ of the mask M. The magnitude of the deflection by the subfield selection deflector 3 is set by a deflection controller 6. The deflection controller 6 is controlled by a main controller 5 which controls the entire system.

The mask M transmits the electron beam EB; magnetic deflectors 12A, 12B then deflect the electron beam EB an amount corresponding to the width of the boundary regions on mask M. This deflection causes the subfields to be transferred without boundary strips along their Y-facing edges. A projection lens 13 then forms a second crossover 7B of the electron beam EB. An objective lens 14 forms an image on the wafer W corresponding to the selected subfield of the mask M. The image is a reduced or enlarged image of the selected subfield of the mask M; typically, the image is demagnified with a demagnification of $\beta=\frac{1}{4}$.

The magnetic deflectors 12A, 12B use series connected coils driven with a current supplied by the deflection controller 6. Similarly, the projection lens 13 and the objective lens 14 have series-connected coils; a focus controller 15, under further control by the main controller 5, supplies the currents to these coils. The position along the optical axis AX (the Z direction) at which the image of the selected subfield forms is controlled electrically.

A mask stage 8 holds the mask M parallel to the XY plane. A mask-stage driver 10 drives the mask stage 8 such that the mask stage 8 moves continuously in the X direction and step-wise in the Y direction. Laser interferometers 9X, 9Y sense the position of the mask stage 8 in the X and Y directions, respectively, for use by the main controller 5.

The wafer W is held generally flat and parallel to the XY plane above a first wafer stage 17 by an electrostatic chuck 16. However, if there is a particle 29 between the bottom of the wafer W and the electrostatic chuck 16, the surface of the wafer W will distort, as shown in FIG. 1. (In FIG. 1, the deformation of the wafer W by the particle 29 is exaggerated so that the deformation is readily apparent.) A wafer-stage driver 22 drives the first wafer stage 17 in continuous movement in the X direction. The first wafer stage is mounted above a second wafer stage 18. The second wafer stage. 18 moves the first wafer stage 17 step-wise in both the X and Y directions. Laser interferometers 21X, 21Y sense the X and Y positions, respectively, of the first wafer stage 17 for use by the main controller 5.

The second wafer stage 18 is supported above a wafer-stage base 20 by three actuators 19A, 19B, 19C. The actuators 19A, 19B, 19C extend or retract in the Z direction under the control of the main controller 5. The position of the wafer W along the optical axis AX (the Z direction) is adjusted by extending or retracting the three actuators 19A, 19B, 19C equally. By moving the wafer W along the optical axis AX, the image of the subfield to be transferred can be focused on the wafer W. The tilt of the surface of the wafer W with respect to the optical axis AX is adjusted by independently extending or retracting the three actuators 19A, 19B, 19C.

In pattern transfer from the mask M to the wafer W the patterns in the field bands $32_1, 32_2, \ldots, 32_j$ of the mask M are sequentially transferred to the wafer W. The wafer W is scanned in either the −X or +X directions at a speed approximately equal to $\beta \cdot V_M$ synchronously with the scanning of the mask M in the +X or −X direction at a speed $V_M$, where $\beta$ is the optical-system magnification from the mask M to the wafer W. If the respective X-widths of the field bands $32_1, 32_2, \ldots, 32_j$ and the boundary regions $35_1, 35_2, \ldots, 35_{N-1}$ on the mask M are $L_A$ and $L_B$, respectively, and the optical system magnification is $\beta$, then the ratio $\beta'$ between the wafer and mask scanning speeds is $\beta'=\beta \cdot L_A/(L_A+L_B)$. (The scan directions of the mask M and the wafer W are generally opposite because the optical system projects an inverted image.)

In the preferred embodiment, the mask stage 8 moves the mask M, and the first and second wafer stages 17 and 18 move the wafer W continuously in the X direction (the scan direction) while the mask patterns are transferred to the wafer W.

During pattern transfer, the height of the wafer W is measured so that the position of the wafer W and the focus of the optical system can be adjusted along the optical axis AX to maintain a high-resolution image of patterns from the mask M on the wafer W. In FIG. 1, a first focus-position sensor 24 senses the height of the wafer surface; the image of the pattern to be transferred must be focused at this Z-axis position. The position on the Z-axis corresponding to the location of the best image of the pattern is called the focus position.

The first focus-position sensor 24 is situated on the −X side of the objective lens 14. The first focus-position sensor 24 senses the focus positions of one or more points on the wafer W within a first read ahead region 28. The first read-ahead region 28 is conveniently displaced a fixed distance in the −X direction from an exposure region 27. The exposure region 27 is a strip that extends along the Y-axis with the optical axis AX approximately at its center. The exposure region 27 is the region in which the optical system transfers patterns from the mask M to the wafer W; the shape of the exposure region 27 corresponds to the shape of one of the field bands $32_1, 32_2, \ldots, 32_j$ on the mask M. The focus-position data obtained by the first focus-position sensor 24 is then supplied to a focus selector 26. For −X scanning the focus sensor should be on the +X side of the objective lens 14 so that the wafer is measured just before it enters the exposure region.

Figure 3:
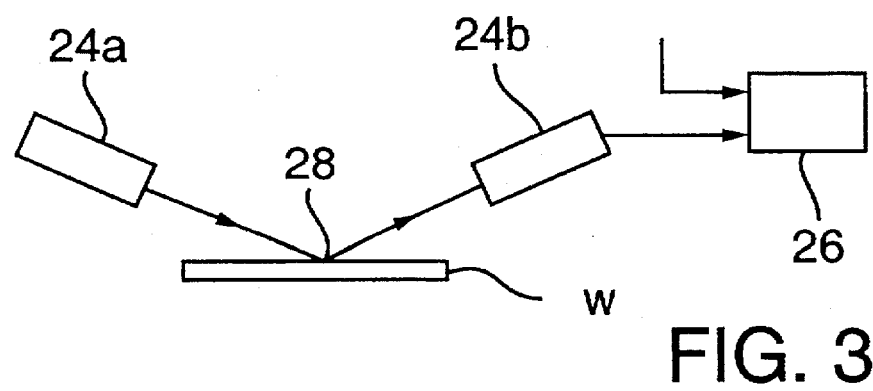
FIG. 3 shows an embodiment of a focus-position sensor 24 of the electron-beam-projection-exposure apparatus of FIG. 1.

As shown in FIG. 3, the first focus-position sensor 24 comprises an optical irradiation system 24a and a position-detection system 24b. The optical irradiation system projects a slit image diagonally onto measurement points within the first read-ahead region 28 of the wafer W. The position-detection system 24b receives light reflected from the wafer W and forms an image of the slit. A change in the focus position of the wafer W laterally displaces the slit image formed by the position-detection system 24b. A focus signal corresponding to the lateral displacement of the slit image is supplied by the position-detection system 24b to the focus selector 26.

The first focus-position sensor 24 senses focus positions at one or more measurement points in the first read-ahead region 28 and supplies focus signals corresponding to these measurement points to the focus selector 26. These focus signals can be mathematically processed to obtain an approximation for the focus positions throughout the first read-ahead region. 28. For example, a least-squares approximation using the focus signals can be used to estimate the shape and tilt of the first read-ahead region 28; this approximation permits the focus selector 26 to provide estimated focus positions for points in the first read-ahead region 28 not measured by the first focus-position sensor 24.

FIG. 1 also shows a second focus-position sensor 25, identical to the first focus-position sensor 24, but placed on the +X side of the objective lens 14. The second focus-position sensor 25 detects focus positions within a second read-ahead region displaced in the +X direction with respect to the exposure region 27. The second focus-position sensor 25 provides focus signals for one or more points in the second read-ahead region to the focus selector 26. These focus signals can be further mathematically processed in the same way as the focus signals from the first focus-position sensor 24.

The focus selector 26 supplies the focus signals from the first and second focus-position sensors 24, 25 to the main controller 5. When the wafer W is scanned in the −X direction (as shown in FIG. 1), the focus signals from the first focus-position sensor 24 are used by the main controller 5; when the scan direction is the +X direction, the focus signals from the second focus-position sensor 25 are supplied to the main controller. 5.

The first and second focus-position sensors 24, 25 are calibrated so that the focus signals are zero when the first read-ahead region 28 and the second read-ahead region are coplanar with the plane of focus of the image of the mask M. The tilt of the wafer W with respect to the image plane and the magnitude of defocus relative to the image plane at the center of the first read-ahead region 28 or the second read-ahead region are calculated at the main controller 5 from the focus signals. Because there are focus-position sensors on both sides of the exposure region 27, position data for focus correction is available for either +X or −X-directed scanning.

The first focus-position sensor 24 can be calibrated by transferring patterns from the mask M to a flat reference wafer of uniform thickness and height held in the electrostatic chuck 16 and placed so that there are no deformations of the reference wafer. Particular care is taken to avoid particles between the reference wafer and the electrostatic chuck 16. The first focus-position sensor 24 then measures a first focus signal from a calibration point on the reference wafer. Next, the first wafer stage 17 moves the reference wafer in the +X direction so that the calibration point is on the optical axis AX. The position (measured along the Z-axis) of the reference wafer is then varied in small increments around the value measured by the first focus-position sensor 24 and the reference wafer is exposed to a test pattern at each increment. The focus signal detected by the first focus-position sensor 24 for the exposed test pattern image with the best resolution is called the offset $\Delta F$. Subtracting the offset $\Delta F$ from the first focus signal calibrates the first focus-position sensor in that the best Z-axis position for the wafer W occurs at the position at which the difference between the first focus signal and the offset $\Delta F$ is zero. It will be readily apparent that a similar calibration can be performed for the second focus-position sensor 25.

After calibration of the first and second focus-position sensors 24, 25 the electron-beam projection-exposure apparatus implements auto-focusing and auto-leveling operations during the exposure of the wafer as follows. For the purposes of the following descriptions, coordinates are chosen so that the wafer W is scanned in the −X direction. It will be readily apparent that bidirectional scanning can be used.

As shown in FIG. 1, the main controller 5 sets the deflection of the electron beam EB with the subfield selection deflector 3 and the magnetic deflectors 12A, 12B using mask and wafer exposure data supplied to the main controller by an input apparatus (not shown). The laser interferometers 9X, 9Y, 21X, 21Y provide stage-position data for the mask stage 8 and the first wafer stage 17. The main controller 5 uses the wafer and mask-exposure data and stage-position data to calculate additional data (such as mask position and velocity) required to control-the mask stage 8 and the first wafer stage 17. The main controller 5 then controls the deflection controller 6 to set the appropriate deflection. The main controller 5 similarly controls the mask stage 8 and the first wafer stage 17 with a mask-stage-drive controller 11 and a wafer-stage-drive controller 23. The mask-stage-drive controller 11 and the wafer-stage-drive controller 23 control their corresponding stages with the mask-stage driver 10 and the wafer-stage driver 22, respectively.

Before beginning the subfield-by-subfield exposure process, the main controller 5 directs the focus selector 26 to accept focus signals from the first focus-position sensor 24. The first focus-position sensor 24 provides wafer height measurements from the read-ahead region 28 in order to determine the Z-axis focus positions required when the portion of the wafer W in the read-ahead region 28 enters the exposure region 27. The main controller 5 moves the first wafer stage 17 in the −X direction, thereby moving an initial exposure region on the wafer W into the exposure region 27. The main controller 5 continues to receive focus signals during this motion, thereby acquiring focus data for other locations on the wafer W.

The main controller 5 directs the first wafer stage 17 to move continuously in the −X direction at a speed corresponding to and synchronized with the continuous motion of the mask stage 8. During scanning, the mask stage 8 moves at speed $V_M$ in the +X direction while patterns of the subfields $33_1, 33_2, \ldots, 33_N$ on the mask M are sequentially transferred to the wafer W.

During exposure, the main controller 5 adjusts the height and tilt of the wafer W in the exposure region 27 using the focus signals obtained from the first focus-position sensor 24. The wafer W is adjusted to be coplanar with the image of the mask M. Especially if the magnitude of the defocus adjustment between the surface of the wafer W and the image plane is large, the main controller 5 can direct a "mechanical" correction of the focus by adjusting the Z-axis position of the first wafer stage 17 using the actuators 19A, 19B, 19C. Especially if the defocus is small, the main controller 5 can direct an "electrical" correction of the focus. This can be done by adjusting the Z position of the image of the mask M. To such end, the main controller 5 can direct the deflection controller 6 to adjust the drive current supplied to the magnetic deflectors 12A, 12B. Alternatively or in addition, the main controller can direct the focus adjuster 15 to adjust the current supplied to the projection lens 13 and objective lens 14. If required, both mechanical and electrical correction of focus may be used.

When the tilt of the wafer W is excessive, the main controller 5 can mechanically adjust the tilt angle of the stage 17 by directing an adjustment of the actuators 19A, 19B, 19C. The main controller 5 uses the focus positions supplied by the first focus-position sensor 24 to determine the adjustment.

As a result of the adjustments, the surface of the wafer W is coplanar with the image plane of the optical system. As pattern transfer proceeds, the defocus is corrected mechanically and/or electrically before transfer of the subfields begins. The main controller 5 uses the focus signals from the focus-position sensor 24 so that the focus adjustments are determined before the measured region reaches the transfer region 27.

Thus by mechanically and/or electrically correcting the defocus based on focus position data read before a region on the wafer W is exposed, pattern transfer occurs such that the exposure region of the wafer W is aligned with the image plane even if there are rapid changes in the surface height of the wafer W. Furthermore, while the mechanical focus and tilt-angle corrections use mechanisms such as the actuators 19A, 19B, 19C that are slow in comparison with electrical correction mechanisms, gradual position and tilt-angle changes supplied by the actuators 19A, 19B, 19C enable accurate focusing and leveling even if the focus error is large. The slower, mechanical mechanisms can provide large corrections; smaller and more rapidly varying focus corrections are preferably performed electrically.

If the first and second focus-position sensors 24, 25 cannot be displaced from the optical axis AX in the scan direction (±X directions) with respect to the exposure region 27, a focus-position sensor may be placed offset in the Y direction (the stepping direction). The wafer W is then scanned with respect to this focus-position sensor prior to exposure and the focus-position data is stored. The main controller 5 then focuses the optical system during exposure using the stored focus-position data.

Because the focus-position measurement points on the wafer W need not be close to the exposure region 27, focus-position sensors can be provided even if the outside diameter of the objective lens 14 is large or the space between the objective lens 14 and the wafer W is small. Therefore, the optical system can have a short working distance and can use large diameter objective lenses.

While the preferred embodiment uses optical sensors to sense focus position, it will be readily apparent that other types of position sensors may be used. For example, the focus-position sensors may be electrostatic capacitance sensors or eddy-current sensors. Because the focus-position sensors need not be close to the exposure region 27, even focus-position sensors that require close proximity to the wafer W are suitable.

The combination of relatively rapid electrical focus correction with a slower mechanical correction provides an extended range over which focus errors can be corrected. The slower mechanical correction is more appropriate for reducing slowly varying large focus errors while the faster electrical correction is more appropriate for reducing focus errors caused by rapid changes in wafer height.

Having illustrated and demonstrated the principles of the invention in a preferred embodiment, it should be apparent to those skilled in the art that the preferred embodiment can be modified in arrangement and detail without departing from such principles. We claim as the invention all that comes within the scope of these claims.

What is claimed is:

1. In a charged-particle-beam projection-exposure apparatus for transferring patterns from a mask onto a sensitized substrate, in which a charged particle beam irradiates a region of the mask and a charged-particle-beam optical system forms an image of the region of the mask on a focal plane of the charged-particle-beam optical system so that the patterns are transferred to the sensitized substrate, the apparatus being operable to move the sensitized substrate and the mask synchronously so that patterns from regions of the masks can be sequentially transferred to the sensitized substrate, an improvement comprising:

(a) a scanning system operable to continuously move the sensitized substrate and the mask synchronously with respect to each other to progressively place successive portions of the mask and corresponding target portions of the sensitized substrate into an exposure position for exposure by the charged-particle-beam projection-exposure apparatus, to scanningly transfer the patterns from the portions of the mask to the corresponding target portions of the sensitive substrate while simultaneously and continuously moving a successive read-ahead region of the sensitized substrate, the read-ahead region being located ahead of the portion being exposed, into a focus-position-measurement position;

(b) a focus-position sensor operable to measure axial displacement of the read-ahead region of the sensitized substrate located at the focus-measurement-position, as successive read-ahead regions continuously move through the focus-position-measurement position, from the focal-plane in which the charred-particle-beam optical system forms an image of the mask; and (c) a focus controller operable to receive the measured axial displacements from the focus-position sensor and to adjust, based upon the measured axial displacements, the relative positions of the target surface and the focal plane of the charged-particle-beam optical system whereby the image of the region of the mask is focused on the target surface of the sensitized substrate after the read-ahead region is moved into the exposure position.

2. The improved charged-particle-beam projection-exposure apparatus of claim 1, wherein the focus controller comprises:

an electrical focus controller operable to electrically adjust the position of the focal plane of the image of the charged-particle-beam optical system by adjusting an electrical current supplied to the charged-particle-beam optical system.

3. The improved charged-particle-beam projection-exposure apparatus of claim 2, wherein the focus controller further comprises:

a mechanical focus controller operable to mechanically adjust the location of the target surface of the sensitized substrate relative to the focal plane of the charged-particle-beam optical system; and a focus-control selector operable to selectively direct the electrical focus controller and the mechanical focus controller based on an axial displacement measurement in the read-ahead region obtained by the focus-position sensor so that the image is formed on the target surface of the sensitized substrate.

4. The improved-charged-particle-beam projection-exposure apparatus of claim 3, wherein the mechanical focus controller is operable to adjust the tilt of the sensitized substrate with respect to the focal plane so that the focal plane and target surface are coplanar.

5. The improved charged-particle-beam projection exposure apparatus of claim 3, further comprising a processor connected to the focus-position sensor, the processor being operable to mathematically process measurements obtained by the focus-position sensor so as to provide an approximation to the focus-position measurements at any point in the read-ahead region.

6. The improved charged-particle-beam projection exposure apparatus of claim 5, wherein the processor is operable to provide the approximation of focus-position measurements using a least-squares fit.

7. The charged-particle-beam projection-exposure apparatus of claim 3, wherein the focus-position sensor comprises an optical focus-position sensor comprising a projection system operable to project an image of a measurement pattern onto the target surface of the sensitized substrate in the read-ahead region, and a condensing optical system operable to collect light reflected from the target surface, to re-image the measurement pattern, and to deliver an output signal corresponding to the displacement of the target surface.

8. In a charged-particle-beam projection-exposure apparatus for transferring patterns from a mask onto a sensitized substrate, in which a charged particle beam irradiates a region of the mask and a charged-particle-beam optical system forms an image of the region of the mask on a focal plane of the charged-particle-beam optical system so that the patterns are transferred to a target surface of the sensitized substrate, the apparatus being operable to move the sensitized substrate and the mask synchronously so that patterns from regions of the masks can be sequentially transferred to the sensitized substrate, an improvement comprising:

(a) a focus-position sensor operable to measure an axial displacement of the target surface, in a read-ahead region of the sensitized substrate, from the focal plane in which the charged-particle-beam optical system forms the image of the mask;

(b) a scanning system operable to (1) move the read-ahead region into an exposure position for exposure by the charged-particle-beam projection-exposure apparatus, and (2) to move the target surface of the sensitized substrate so that the focus-position sensor measures the displacements of the target surface in read-ahead regions corresponding to all patterns to be transferred before beginning exposure of the sensitized substrate to the charged particle beam; and (c) a focus controller operable to receive the measured axial displacements from the focus-position sensor and to adjust, based upon the measured axial displacements, the relative positions of the target surface and the focal plane of the charged-particle-beam optical system whereby the image of the region of the mask is focused on the target surface of the sensitized substrate after the read-ahead region is moved into the exposure position, the focus controller comprising (1) an electrical focus controller operable to electrically adjust the position of the focal plane of the image of the charged-particle-beam optical system by adjusting an electrical current supplied to the charged-particle-beam optical system; (2) a mechanical focus controller operable to mechanically adjust the location of the target surface of the sensitized substrate relative to the focal plane of the charged-particle-beam optical system; and (3) a focus-control selector operable to selectively direct the electrical focus controller and the mechanical focus controller based on an axial displacement measurement in the read-ahead region obtained by the focus-position sensor so that the image is formed on the target surface of the sensitized substrate.

9. In a method for transferring a pattern from a mask onto a surface of a sensitized substrate in which a region of the mask is irradiated with a charged particle beam and an image of the irradiated region is projected with a charged-particle-beam optical system onto a focal plane in proximity to which the sensitized substrate is placed and in which the sensitized substrate and the mask are moved synchronously so that the patterns defined by regions of the mask are sequentially transferred to the surface of the sensitized substrate, an improvement comprising:

(a) while continuously moving the mask and substrate relative to each other in a synchronous manner through an exposure position of the CPB optical system to scanningly transfer patterns from sequentially arranged regions of the mask to corresponding target regions of the sensitive substrate, continuously moving a successive read-ahead region of the sensitized substrate, destined to be exposed to the charged-particle beam through the charged-particle-beam optical system, into a focus-position-measurement position;

(b) at the focus-position-measurement position, measuring a displacement of the substrate surface from the focal plane of the charged-particle-beam optical system in the continuously moving read-ahead region of the sensitized substrate; and (c) based on the measurement obtained in step (b), adjusting relative positions of the target surface and the focal plane so that the image of the region of the mask is focused on the target surface of the sensitized substrate after the read-ahead region is moved into the exposure region.

10. In a method for transferring a pattern from a mask onto a surface of a sensitized substrate in which a region of the mask is irradiated with a charged particle beam and an image of the irradiated region is projected with a charged-particle-beam optical system onto a focal plane in proximity to which the sensitized substrate is placed and in which the sensitized substrate and the mask are moved synchronously so that the patterns defined by regions of the mask are sequentially transferred to the surface of the sensitized substrate, an improvement comprising:

(a) while continuously moving the mask and substrate relative to each other in a synchronous manner through an exposure position of the charged-particle-beam optical system to scanningly transfer patterns from sequentially arranged regions of the mask to corresponding target regions of the sensitive substrate, continuously moving a successive read-ahead region of the sensitized substrate, destined to be exposed to the charged-particle beam through the charged-particle-beam optical system;

(b) at the focus-position-measurement position, measuring a displacement of the substrate surface from the focal plane of the charged-particle-beam optical system in the continuously moving read-ahead region of the sensitized substrate (c) based on the measurement obtained in step (b), adjusting an electrical current supplied to a charged-particle-beam deflector so that the image of the region of the mask is imaged at a correct position on the target surface of the sensitized substrate after the read-ahead region is moved into the exposure region.

* * * * *

UNITED STATES PATENT AND TRADEMARK OFFICE
CERTIFICATE OF CORRECTION

PATENT NO. : 5,894,132
DATED : April 13, 1999
INVENTOR(S) : Nakasuji, et al

It is certified that error appears in the above-identified patent and that said Letters Patent is hereby corrected as shown below:

Column 3, line 47, "$33_2 \ldots, 33_N$" should be --$33_2, \ldots, 33_N$--.

Column 5, line 25, delete the period between "stage" and "18".

Column 5, line 51, "$35_2, \ldots 35_{N-1}$" should be --$35_2, \ldots, 35_{N-1}$--.

Signed and Sealed this

First Day of February, 2000

Attest:

Q. TODD DICKINSON

Attesting Officer

Acting Commissioner of Patents and Trademarks